(12) United States Patent
Tsai et al.

(10) Patent No.: US 10,014,260 B2
(45) Date of Patent: Jul. 3, 2018

(54) PACKAGE STRUCTURE AND METHOD FOR FORMING THE SAME

(71) Applicant: Taiwan Semiconductor Manufacturing Co., Ltd., Hsinchu (TW)

(72) Inventors: Yi-Da Tsai, Dongshi Township, Chiayi County (TW); Cheng-Ping Lin, Hsinchu County (TW); Wei-Hung Lin, Xinfeng Township, Hsinchu County (TW); Chih-Wei Lin, Zhubei (TW); Ming-Da Cheng, Zhubei (TW); Ching-Hua Hsieh, Hsinchu (TW); Chung-Shi Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/347,912

(22) Filed: Nov. 10, 2016

(65) Prior Publication Data

US 2018/0130749 A1    May 10, 2018

(51) Int. Cl.
*H01L 23/552* (2006.01)
*H01L 21/56* (2006.01)
(Continued)

(52) U.S. Cl.
CPC ...... *H01L 23/5389* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/295* (2013.01); *H01L 23/3135* (2013.01); *H01L 23/5386* (2013.01); *H01L 24/17* (2013.01); *H01L 24/81* (2013.01); *H01L 24/96* (2013.01); *H01L 24/97* (2013.01);
(Continued)

(58) Field of Classification Search
None
See application file for complete search history.

(56) References Cited

U.S. PATENT DOCUMENTS 8,361,842 B2   1/2013   Yu et al.
8,680,647 B2   3/2014   Yu et al.
(Continued)

*Primary Examiner* — Khaja Ahmad
(74) *Attorney, Agent, or Firm* — Birch, Stewart, Kolasch & Birch, LLP

(57) ABSTRACT

Package structures and methods for forming the same are provided. A method for forming a package structure includes providing a carrier substrate. The method also includes forming a conductive layer over the carrier substrate. The method further includes forming a passivation layer over the conductive layer. The passivation layer includes openings that expose portions of the conductive layer. In addition, the method includes bonding integrated circuit dies to the portions of the conductive layer through bumps. There is a space between the integrated circuit dies and the passivation layer. The method also includes filling the space with a first molding compound. The first molding compound surrounds the bumps and the integrated circuit dies. The method further includes forming a second molding compound capping the first molding compound and the integrated circuit dies. The passivation layer has a sidewall that is covered by the second molding compound.

20 Claims, 14 Drawing Sheets

(51) Int. Cl.
  *H01L 23/538* (2006.01)
  *H01L 23/00* (2006.01)
  *H01L 23/31* (2006.01)
  *H01L 21/48* (2006.01)
  *H01L 21/683* (2006.01)
  *H01L 23/29* (2006.01)

(52) U.S. Cl.
  CPC ........... *H01L 2221/68345* (2013.01); *H01L 2224/13144* (2013.01); *H01L 2224/13147* (2013.01); *H01L 2224/13155* (2013.01); *H01L 2224/13164* (2013.01); *H01L 2224/16227* (2013.01); *H01L 2224/81815* (2013.01); *H01L 2924/3511* (2013.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2009/0315156 A1* | 12/2009 | Harper | H01L 23/552 257/660 |
| 2010/0140759 A1* | 6/2010 | Pagaila | H01L 21/565 257/660 |
| 2011/0291288 A1 | 12/2011 | Wu et al. | |
| 2012/0228749 A1* | 9/2012 | Pagaila | H01L 23/147 257/659 |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0214110 A1 | 7/2015 | Lin et al. | |
| 2016/0276307 A1* | 9/2016 | Lin | H01L 21/561 |

\* cited by examiner

PACKAGE STRUCTURE AND METHOD FOR FORMING THE SAME

BACKGROUND

With the constant evolution of semiconductor technology, semiconductor dies are increasingly becoming smaller. More functions, however, need to be integrated into these semiconductor dies. Accordingly, these semiconductor dies have increasingly greater numbers of I/O pads packaged into smaller areas, and the density of the I/O pads is quickly rising. As a result, the packaging of semiconductor dies is becoming more difficult.

Package technologies can be divided into multiple categories. In one of the categories of packaging, dies are sawed from wafers before they are packaged onto other wafers, and only "known-good-dies" are packaged. An advantage of this packaging technology is the possibility of forming fan-out chip packages, which means that the I/O pads on a die can be redistributed to a greater area than the die itself. Therefore, the number of I/O pads packed on the surfaces of the dies can be increased.

New packaging technologies have been developed to further improve the density and functions of semiconductor dies. These relatively new types of packaging technologies for semiconductor dies face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
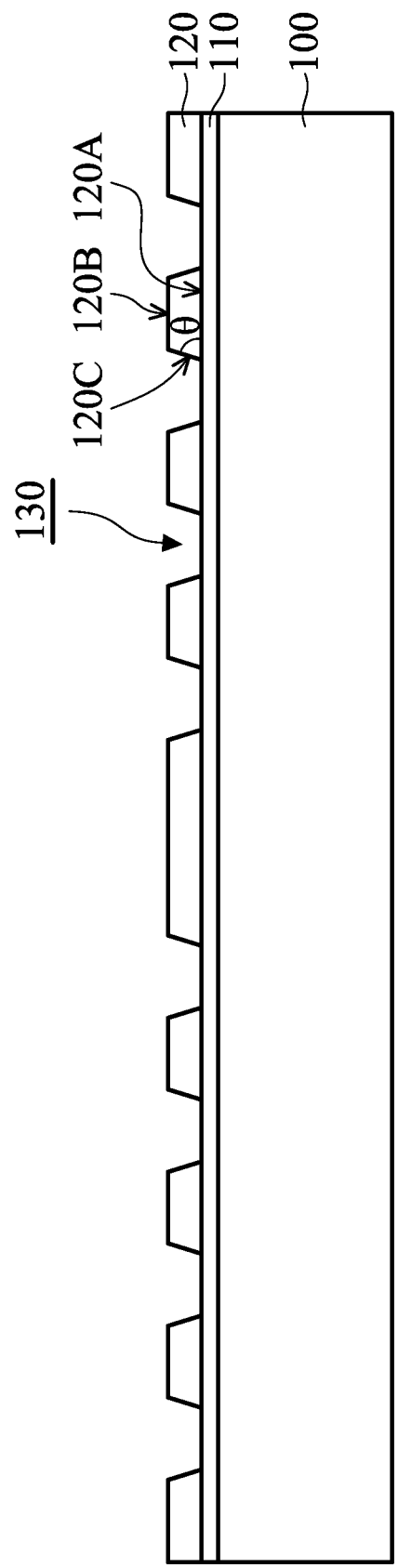
FIGS. 1A-1I are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
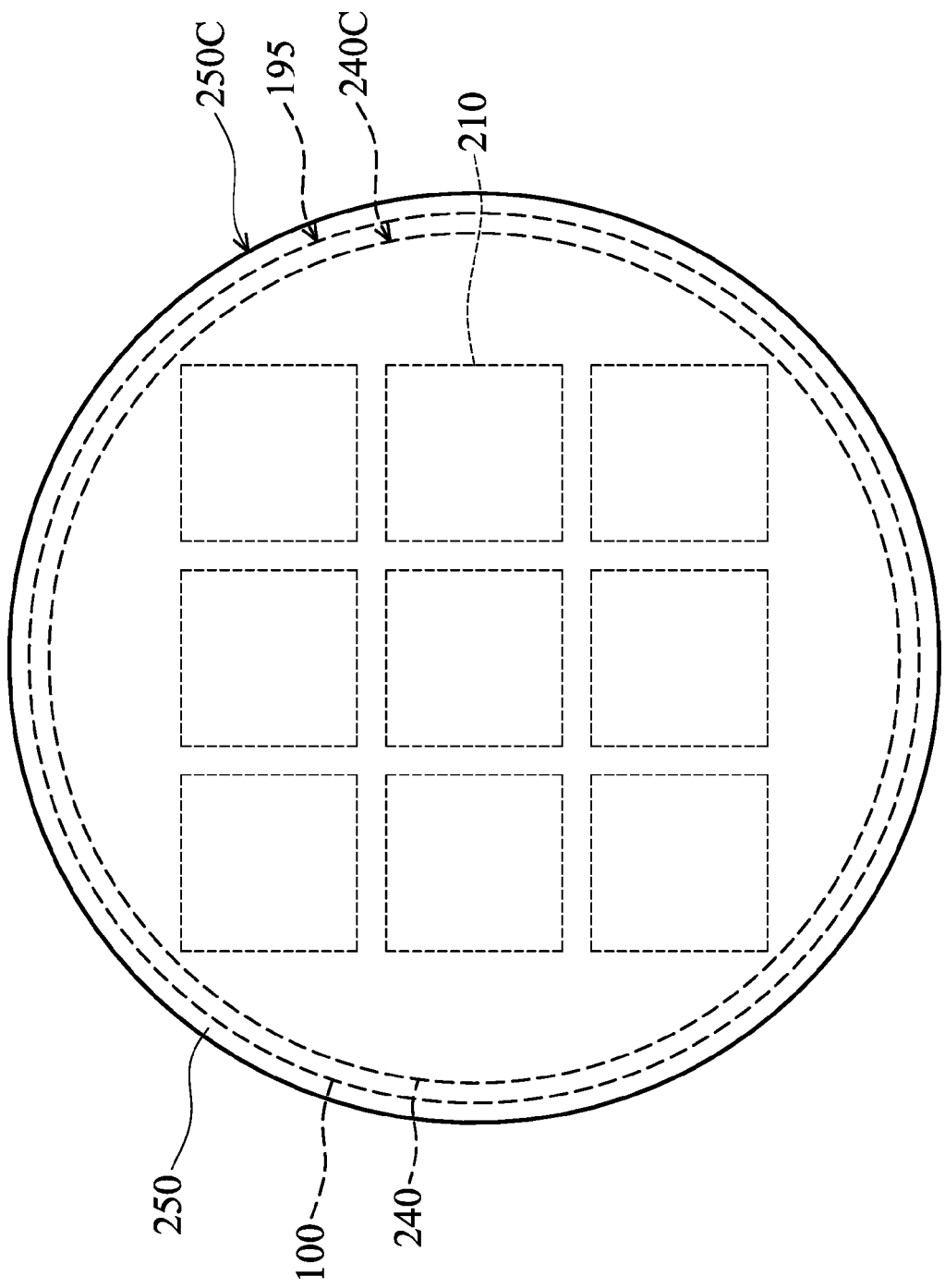
FIG. 2 is a top view of one stage of a process for forming a package structure, in accordance with some embodiments.
Figure 3:
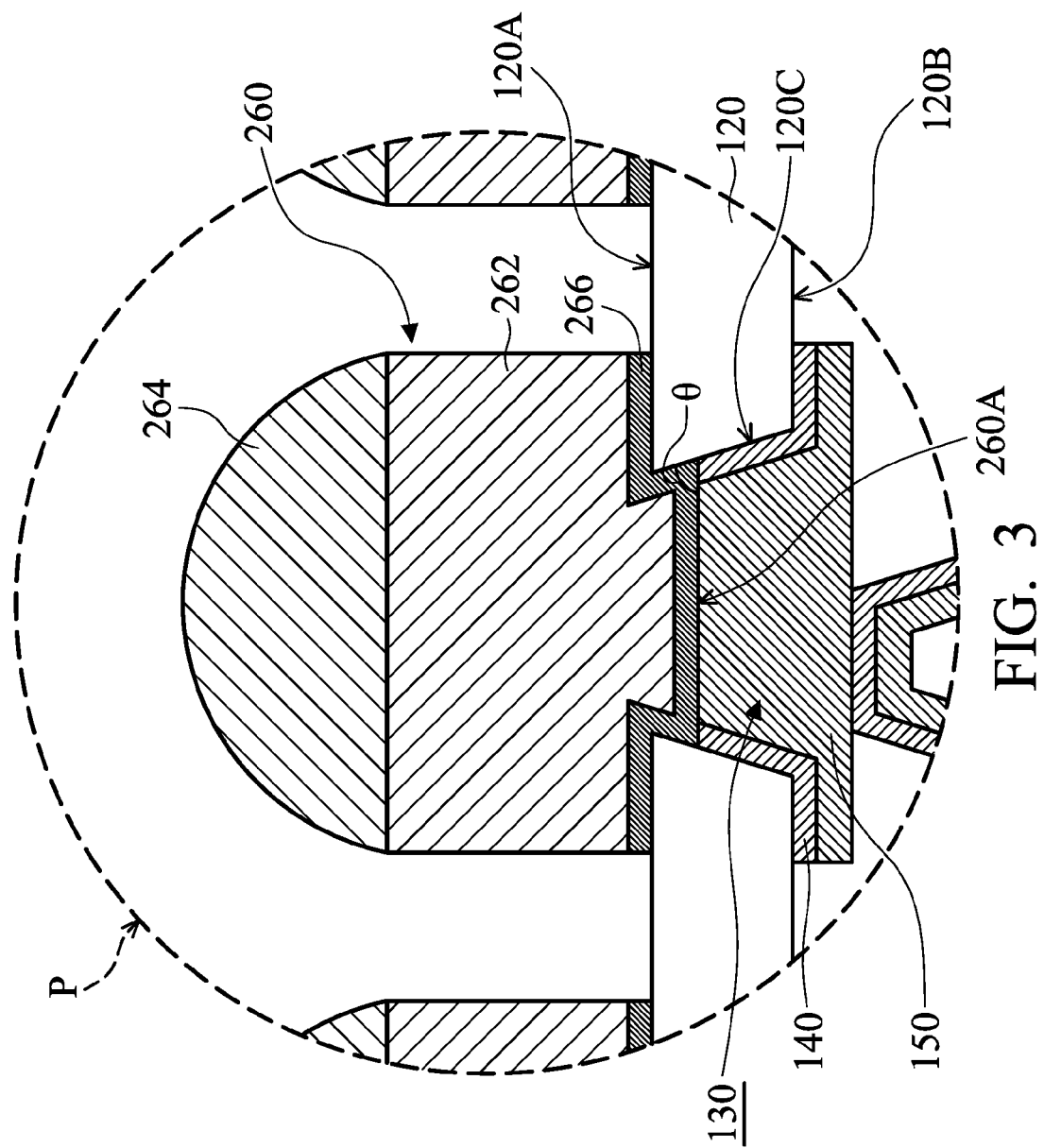
FIG. 3 is an enlarged cross-sectional view of a package structure, in accordance with some embodiments.

Some embodiments of the disclosure are described. FIGS. 1A-1I are cross-sectional views of various stages of a process for forming a package structure, in accordance with some embodiments. FIG. 2 is a top view of one stage of a process for forming a package structure, in accordance with some embodiments. FIG. 3 is an enlarged cross-sectional view of a package structure, in accordance with some embodiments.

Additional operations can be provided before, during, and/or after the stages described in FIGS. 1A-1I. Some of the stages that are described can be replaced or eliminated for different embodiments. Additional features can be added to the package structure. Some of the features described below can be replaced or eliminated for different embodiments. Although some embodiments are discussed with operations performed in a particular order, these operations may be performed in another logical order.

As shown in FIG. 1A, a carrier substrate 100 is provided, in accordance with some embodiments. In some embodiments, the carrier substrate 100 is used as a temporary substrate. The temporary substrate provides mechanical and structural support during subsequent processing steps, such as those described in more detail later. Afterwards, the carrier substrate 300 may be removed.

In some embodiments, the carrier substrate 100 includes a semiconductor substrate, a glass substrate, a ceramic substrate, a polymer substrate, another suitable substrate, or a combination thereof. In some embodiments, the carrier substrate 100 is a silicon wafer or another suitable wafer.

Afterwards, an adhesive layer 110 is deposited over the carrier substrate 100, in accordance with some embodiments. The adhesive layer 110 may be made of glue, or may be a lamination material, such as a foil. In some embodiments, the adhesive layer 110 is photosensitive and is easily detached from the carrier substrate 100 by light irradiation. For example, shining ultra-violet (UV) light or laser light on the carrier substrate 100 is used to detach the adhesive layer 110. In some embodiments, the adhesive layer 110 is a light-to-heat-conversion (LTHC) coating. In some other embodiments, the adhesive layer 110 is heat-sensitive and is easily detached from the carrier substrate 100 when it is exposed to heat.

Subsequently, a passivation layer 120 with openings 130 is formed over the adhesive layer 110, in accordance with some embodiments. As a result, the adhesive layer 110 is partially exposed from the openings 130.

The passivation layer 120 has a surface 120A that faces the adhesive layer 110, and a surface 120B that faces away from the adhesive layer 110. The passivation layer 120 has a sidewall 120C adjoining one of the openings 130. In some embodiments, the sidewall 120C is inclined to the surfaces 120A and 120B. In some embodiments, there is an acute angle between the sidewall 120C and the surface 120A. In some embodiments, the angle θ between the sidewall 120C and the surface 120A is greater than 0° and is less than or substantially equal to 90°. However, embodiments of the disclosure are not limited thereto. In some other embodiments, the sidewall 120C is substantially perpendicular to the surfaces 120A and 120B.

In some embodiments, the passivation layer 120 is made of a polymer material. In some embodiments, the passivation layer 120 includes polyimide, polybenzoxazole (PBO), benzocyclobutene (BCB), silicone, acrylates, siloxane, another suitable material, or a combination thereof. In some other embodiments, the passivation layer 120 includes non-organic materials. The non-organic materials may include silicon oxide, un-doped silicate glass, silicon oxynitride, solder resist (SR), silicon nitride, silicon carbide, hexamethyldisilazane (HMDS), another suitable material, or a combination thereof.

Multiple deposition, coating, and/or etching processes may be used to form the passivation layer 120 with the openings 130. For example, a chemical vapor deposition (CVD) process or a spin-on coating process may be used to deposit the passivation layer 120. Afterwards, an etching process may be used to form the openings 130.

Figure 1B:
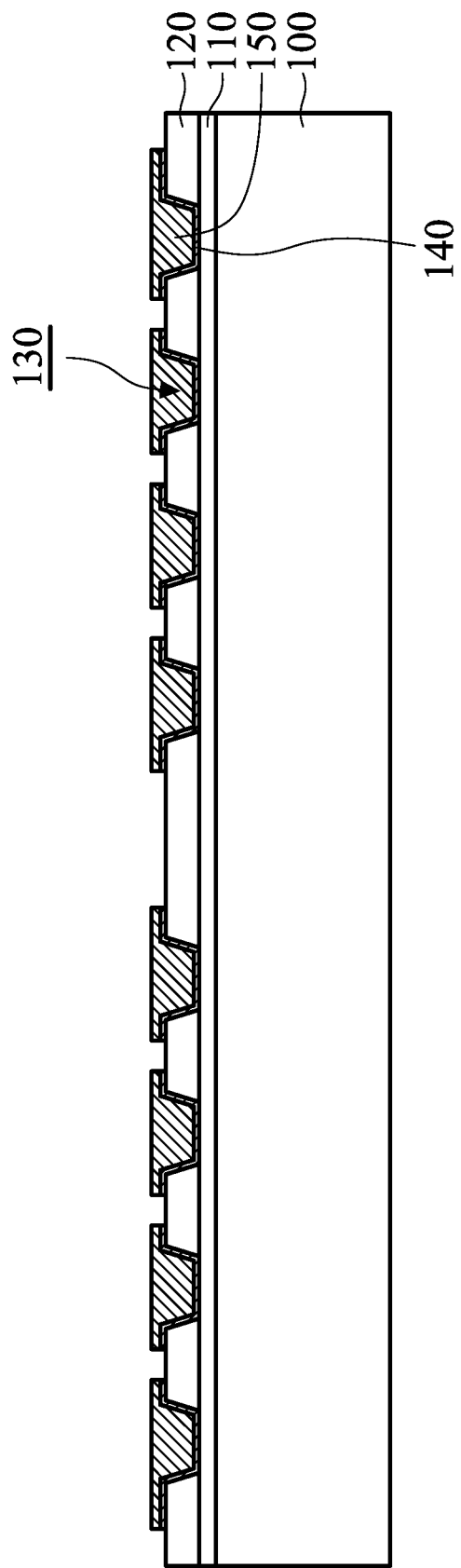

As shown in FIG. 1B, a patterned redistribution layer including conductive layers 140 and 150 is formed over the passivation layer 120, in accordance with some embodiments. The conductive layers 140 and 150 extend along the surface 120B of the passivation layer 120 and extend into the openings 130 of the passivation layer 120. The conductive layer 140 is between the conductive layer 150 and the surface 120B and extends between the conductive layer 150 and the sidewall 120C.

In some embodiments, the openings 130 are substantially fully filled with the conductive layers 140 and 150. In some other embodiments, the openings 130 are substantially fully filled with the conductive layers 140 and 150 and another material layer.

In some embodiments, the conductive layer 140 is a seed layer and is thinner than the conductive layer 150. In some embodiments, the conductive layer 140 includes titanium (Ti). However, embodiments of the disclosure are not limited thereto. For example, the conductive layer 140 may include Ti alloy, copper (Cu), Cu alloy, another suitable seed material, or a combination thereof. The Ti alloy or the Cu alloy may include silver, chromium, nickel, tin, gold, tungsten, another suitable element, or a combination thereof. In some embodiments, the conductive layer 140 is deposited using a physical vapor deposition (PVD) process, a CVD process, another applicable process, or a combination thereof.

In some embodiments, the conductive layer 150 is made of a metal material. The metal material includes Cu, aluminum (Al), tungsten (W), gold (Au), another suitable material, or a combination thereof. In some embodiments, the conductive layer 150 is deposited using an electroplating process, a sputtering process, another applicable process, or a combination thereof. Multiple etching processes may be used to pattern the conductive layers 140 and 150 to form the patterned redistribution layer.

Figure 1C:
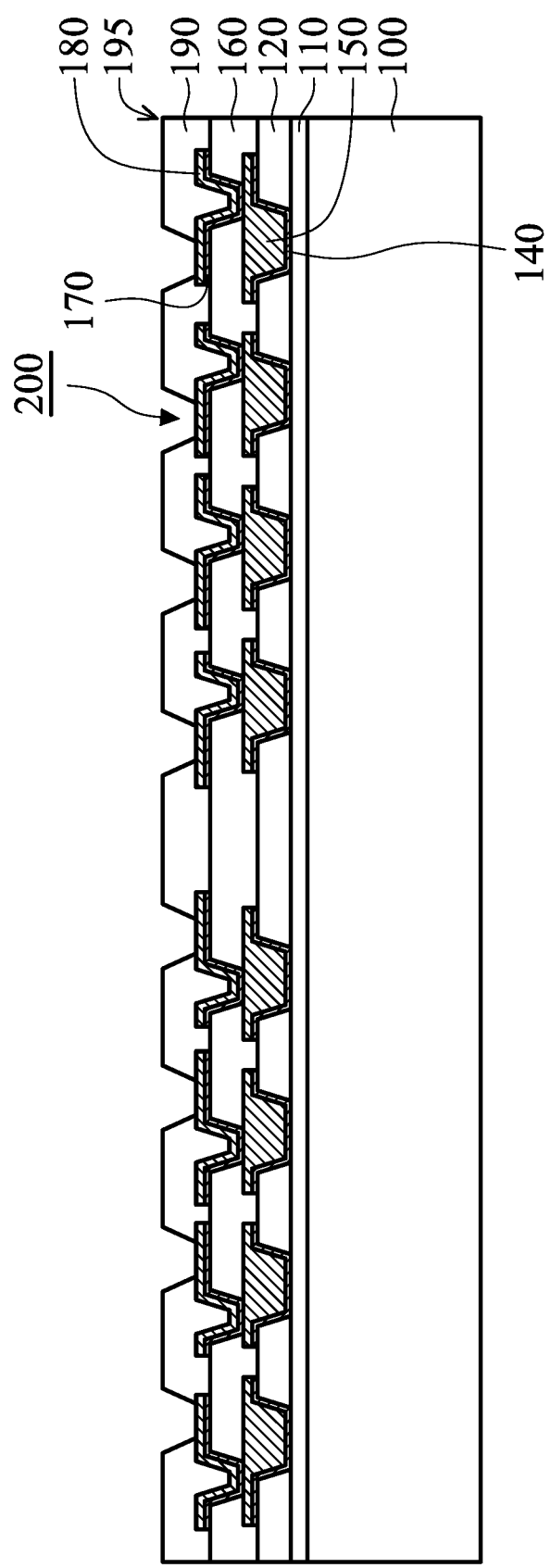

As shown in FIG. 1C, a passivation layer 160 with openings is formed over the passivation layer 120 and the conductive layer 150, in accordance with some embodiments. The conductive layer 150 is partially exposed from the openings of the passivation layer 160. In some embodiments, the materials and/or formation methods of the passivation layer 160 are similar to those of the passivation layer 120.

Afterwards, a patterned redistribution layer including conductive layers 170 and 180 is formed over the passivation layer 160, in accordance with some embodiments. The conductive layers 170 and 180 extend into the openings of the passivation layer 160. In some embodiments, the materials and/or formation methods of the conductive layers 170 and 180 are similar to those of the conductive layers 140 and 150, respectively.

Subsequently, a passivation layer 190 with openings 200 is formed over the passivation layer 160 and the conductive layer 180, in accordance with some embodiments. As a result, the conductive layer 180 is partially exposed from the openings 200 to provide a landing area for connectors, which will be described in more detail later. The passivation layer 190 may or may not fill the openings of the passivation layer 160. In some embodiments, the passivation layers 120, 160 and 190 and the carrier substrate 100 have a substantially coplanar sidewall or edge 195. In some embodiments, the materials and/or formation methods of the passivation layer 190 are similar to those of the passivation layer 120.

Figure 1D:
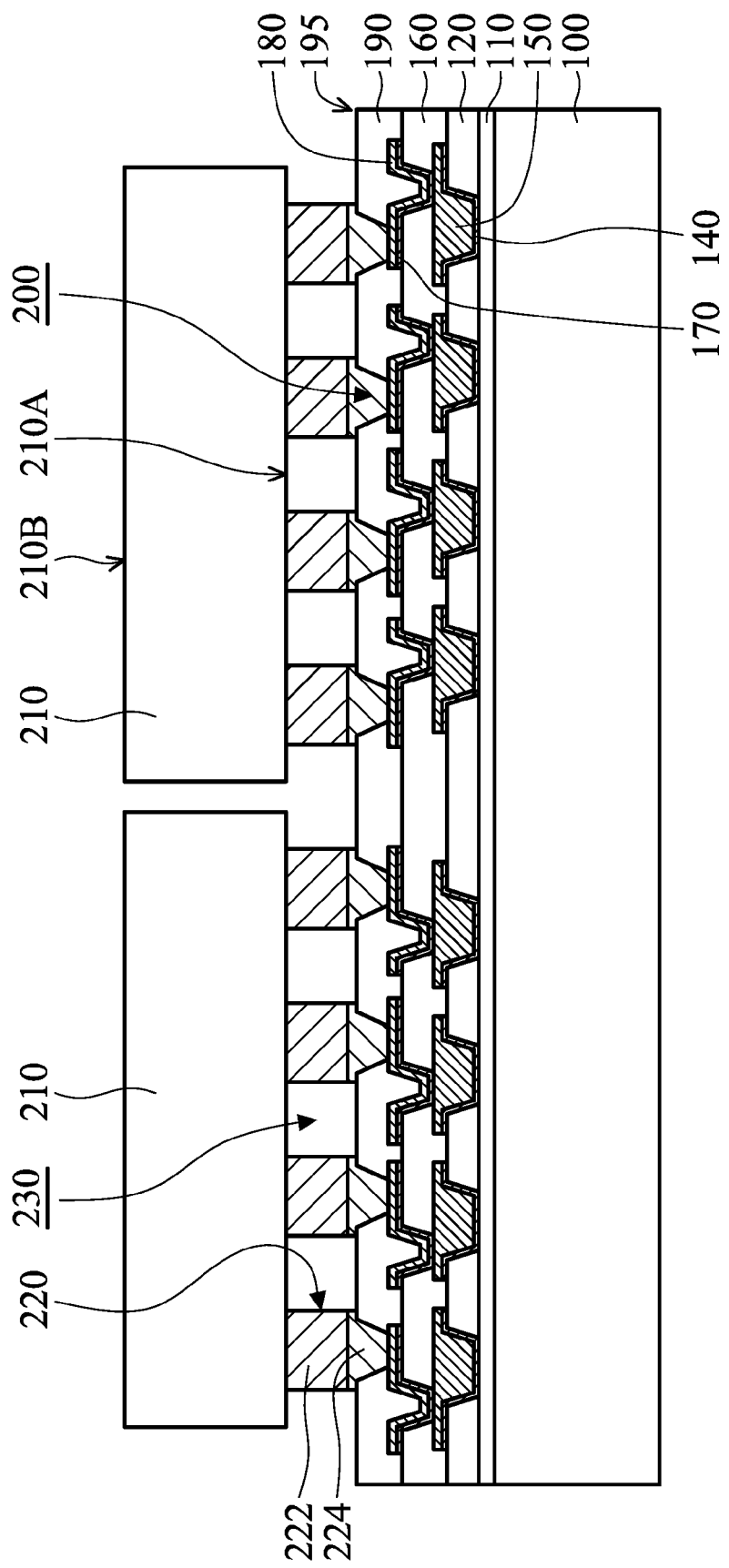

As shown in FIG. 1D, multiple integrated circuit dies 210 are bonded to the exposed portions of the conductive layer 180 through connectors 220, in accordance with some embodiments. The integrated circuit dies 210 are electrically connected to the redistribution layers including the conductive layers 150, 160, 170 and 180 through the connectors 220. In some embodiments, the integrated circuit dies 210 are arranged in an array inside edge 195, as shown in FIG. 2.

In some embodiments, the integrated circuit dies 210 have an active surface 210A that faces the passivation layer 190, and a non-active surface 210B that faces away from the passivation layer 190. In some embodiments, there is a space 230 between the active surface 210A of the integrated circuit dies 210 and the passivation layer 190.

The integrated circuit dies 210 are device dies including transistors, diodes, or another suitable integrated circuit element. The device dies may also include capacitors, inductors, resistors, another integrated circuit element, or a combination thereof. In some embodiments, the integrated circuit dies 210 are sensor dies, logic dies, central processing unit (CPU) dies, memory dies, or another suitable dies. For example, the integrated circuit dies 210 may be High-Bandwidth Memory (HBM) elements, System on Chip (SoC) elements, or a combination thereof.

In some embodiments, each of the connectors 220 includes a conductive bump 222 and a solder layer 224. The conductive bump 222 is between one of the integrated circuit dies 210 and the solder layer 224. The conductive bump 222 may be a conductive pillar, another suitable conductive feature, or a combination thereof. In some embodiments, the conductive bump 222 includes copper, electroless nickel immersion gold (ENIG), electroless nickel electroless palladium immersion gold (ENEPIG), another suitable material, or a combination thereof.

In some embodiments, the solder layer 224 is over the passivation layer 190 and fills the openings 200 to electrically connect to the conductive layer 180. In some embodiments, a reflow process is performed to bond the solder layer 224 and the conductive layer 180 together. However, embodiments of the disclosure are not limited thereto. In some other embodiments, the solder layer 224 is electrically connected to the conductive layer 180 through another connector in the openings 200.

Many variations and/or modifications can be made to embodiments of the disclosure. In some other embodiments, the connectors 220 do not include conductive pillars. In some other embodiments, the connectors 220 are solder bumps, solder balls, other suitable connectors, or a combination thereof.

Figure 1E:
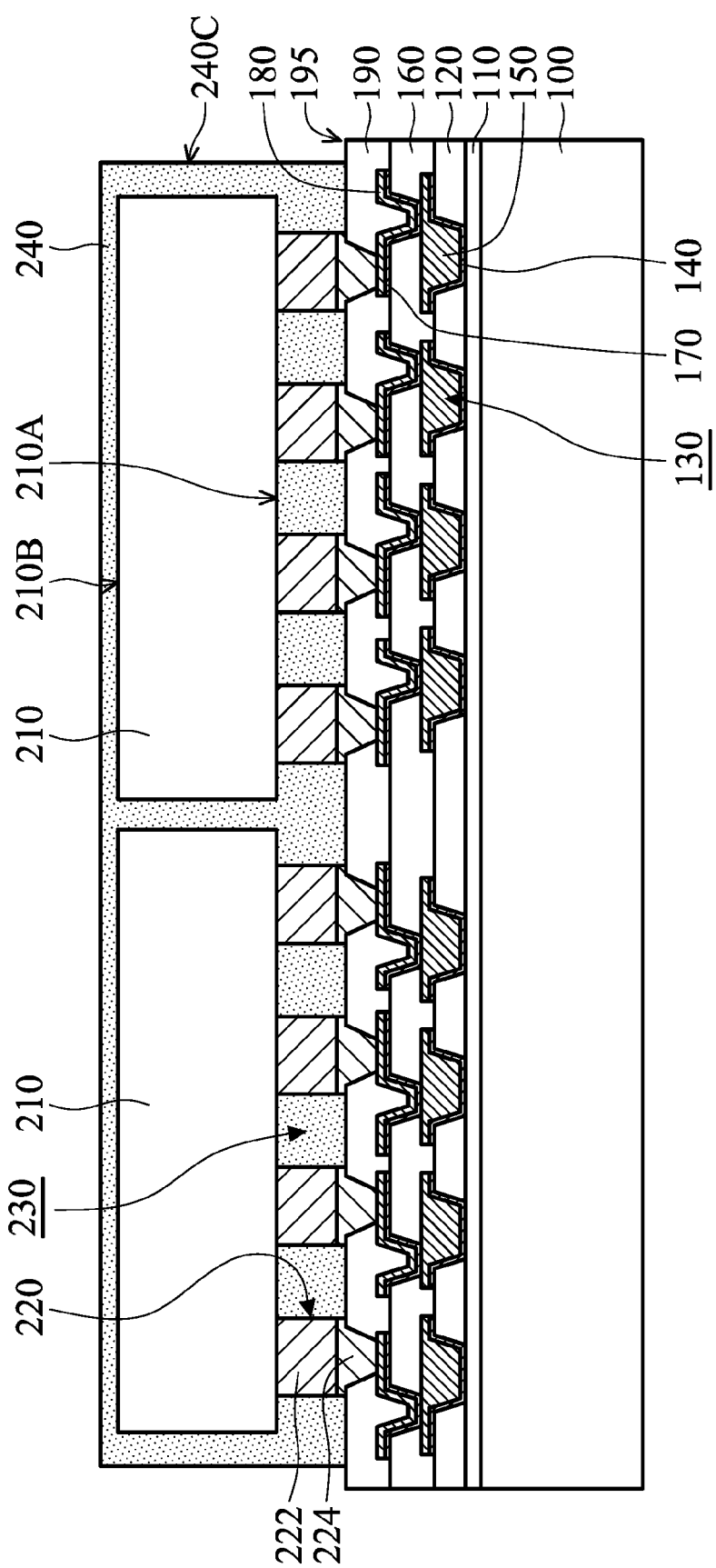

As shown in FIG. 1E, a package layer 240 is formed over the passivation layer 190, in accordance with some embodiments. In some embodiments, the package layer 240 extends over the non-active surface 210B of the integrated circuit dies 210. As a result, the integrated circuit dies 210 are embedded in the package layer 240. In some embodiments, the package layer 240 has a sidewall 240C that is not aligned to the edge 195. In some embodiments, the sidewall 240C is substantially parallel to the edge 195.

In some embodiments, the package layer 240 fills the space 230 between the integrated circuit dies 210 and the passivation layer 190. As a result, the package layer 240 continuously surrounds the connectors 220. In some embodiments, the package layer 240 is in direct contact with the connectors 220, the integrated circuit dies 210 and the passivation layer 190.

Many variations and/or modifications can be made to embodiments of the disclosure. In some other embodiments, the space 230 is filled with another package layer that is surrounded by the package layer 240. As a result, the package layer 240 is not in direct contact with the connectors 220.

As shown in FIG. 2, the package layer 240 extends along the edge 195, in accordance with some embodiments. As a result, the package layer 240 continuously surrounds the integrated circuit dies 210. In some embodiments, the package layer 240 is spaced apart from the edge 195. In some embodiments, the package layer 240 is retracted inwardly from the edge 195. In some embodiments, the package layer 240 has a size or diameter that is less than that of the carrier substrate 100. As a result, the package layer 240 partially exposes the passivation layer 190.

In some embodiments, the package layer 240 includes a polymer material or another suitable encapsulating material. In some embodiments, the package layer 240 includes a molding compound. In some embodiments, the package layer 240 has a coefficient of thermal expansion (CTE) in a range from about 9 ppm/° C. to about 20 ppm/° C. In some embodiments, the package layer 240 has fillers dispersed therein. The fillers may include insulating fibers, insulating particles, other suitable elements, or a combination thereof. In some embodiments, the content or concentration of the fillers dispersed in the package layer 240 is in a range from about 70 wt % to about 85 wt %. In some embodiments, the size of the fillers dispersed in the package layer 240 is in a range from about 10 μm to about 20 μm. In some embodiments, the package layer 240 is formed by an immersion molding process, another applicable process, or a combination thereof.

Figure 1F:
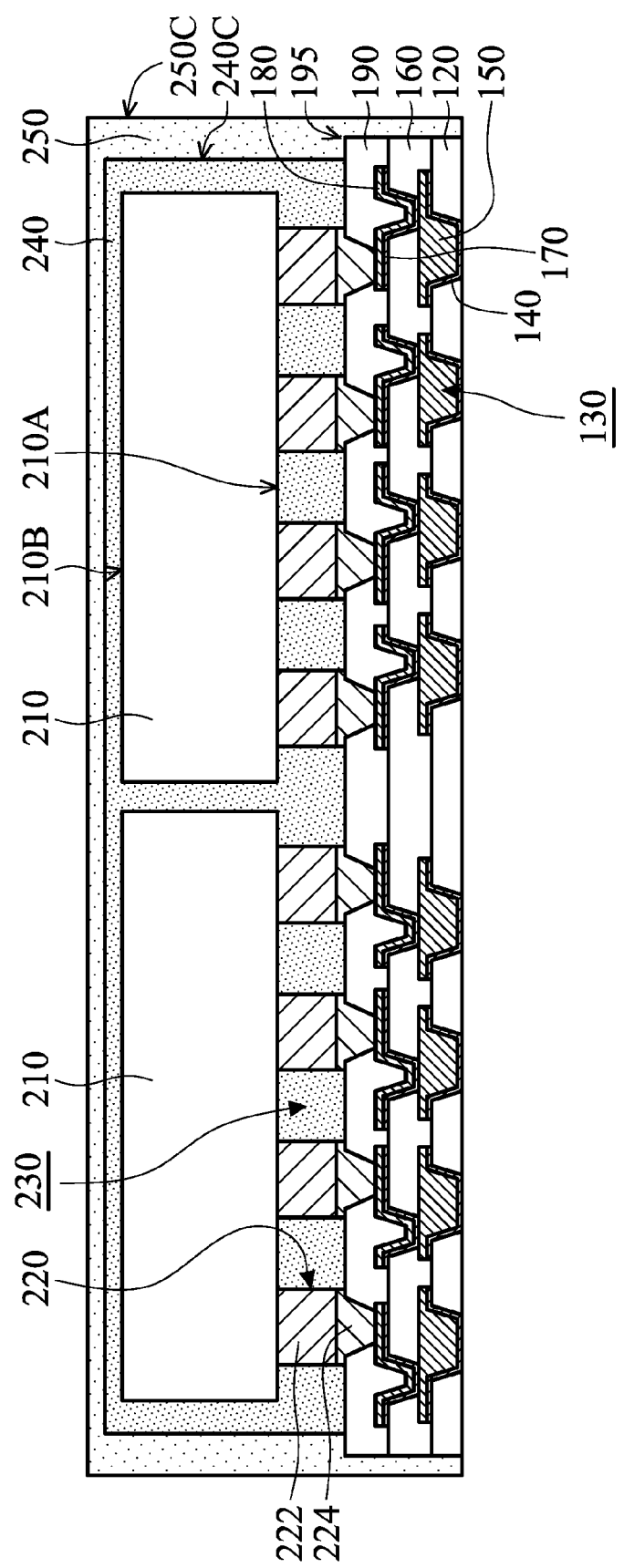

As shown in FIG. 1F, a package layer 250 is formed over the passivation layer 190, in accordance with some embodiments. The package layer 250 caps the package layer 240 and the integrated circuit dies 210. In some embodiments, the package layer 250 covers the sidewall 240C of the package layer 240. In some embodiments, the package layer 250 extends over the non-active surface 210B of the integrated circuit dies 210 to cover the top surface of the package layer 240. As a result, the package layer 240 is embedded in the package layer 250.

In some embodiments, the package layer 250 is in direct contact with the package layer 240 and the passivation layer 190. In some embodiments, the package layer 250 extends from the sidewall 240C of the package layer 240 to the edge 195. In some embodiments, the package layer 250 further extends to cover the edge 195. In some embodiments, the package layer 250 has a sidewall 250C that is not aligned to the sidewall 240C and the edge 195. In some embodiments, the sidewall 250C is substantially parallel to the sidewall 240C and/or the edge 195.

As shown in FIG. 2, the package layer 250 extends along the edge 195, in accordance with some embodiments. As a result, the package layer 250 continuously surrounds the edge 195. In some embodiments, the package layer 250 extends across the edge 195. In some embodiments, the package layer 250 has a size or diameter that is greater than that of the carrier substrate 100 and the package layer 240.

In some embodiments, the package layer 250 includes a polymer material or another suitable encapsulating material. In some embodiments, the package layer 250 includes a molding compound. In some embodiments, the package layers 240 and 250 include the same material. However, embodiments of the disclosure are not limited thereto. In some other embodiments, the package layers 240 and 250 include different materials. The package layer 250 may include multiple sub-layers.

In some embodiments, the package layer 250 has a CTE in a range from about 15 ppm/° C. to about 35 ppm/° C. The CTE of the package layer 250 may be less than, substantially equal to or greater than that of the package layer 240. The CTE of the package layer 250 can be varied according to requirements.

In some embodiments, the package layer 250 has fillers dispersed therein. The fillers may include insulating fibers, insulating particles, other suitable elements, or a combination thereof. In some embodiments, the content or concentration of the fillers dispersed in the package layer 250 is in a range from about 65 wt % to about 80 wt %. In some embodiments, the size of the fillers dispersed in the package layer 250 is in a range from about 20 μm to about 75 μm. In some embodiments, the fillers dispersed in the package layer 250 have a (maximum) size that is greater than the fillers dispersed in the package layer 240.

In some embodiments, the package layer 250 is formed by a compression molding process, an immersion molding process, another applicable process, or a combination thereof. In some embodiments, a liquid molding compound material is applied over the passivation layer 190 and the package layer 240 to encapsulate and cap the package layer 240 and the integrated circuit dies 210. In some embodiments, a thermal process is then applied to harden the molding compound material and to transform it into the package layer 250. In some embodiments, the thermal process is performed at a temperature in a range from about 200° C. to about 230° C. The operation time of the thermal process may be in a range from about 1 hour to about 3 hours.

As shown in FIG. 1F, the carrier substrate 100 is removed from the passivation layer 120, in accordance with some embodiments. As a result, the conductive layer 140 in the openings 130 of the passivation layer 120 is partially exposed. In some embodiments, the carrier substrate 100 is detached from the passivation layer 120 by light irradiation on the adhesive layer 110.

In some embodiments, the carrier substrate 100 is detached from the passivation layer 120 after the formation of the package layer 250. As a result, the conductive layer 140 in the openings 130 is protected by the carrier substrate 100 during the formation of the package layer 250. However, embodiments of the disclosure are not limited thereto. In some other embodiments, the carrier substrate 100 is detached from the passivation layer 120 before the formation of the package layer 250.

Figure 1G:
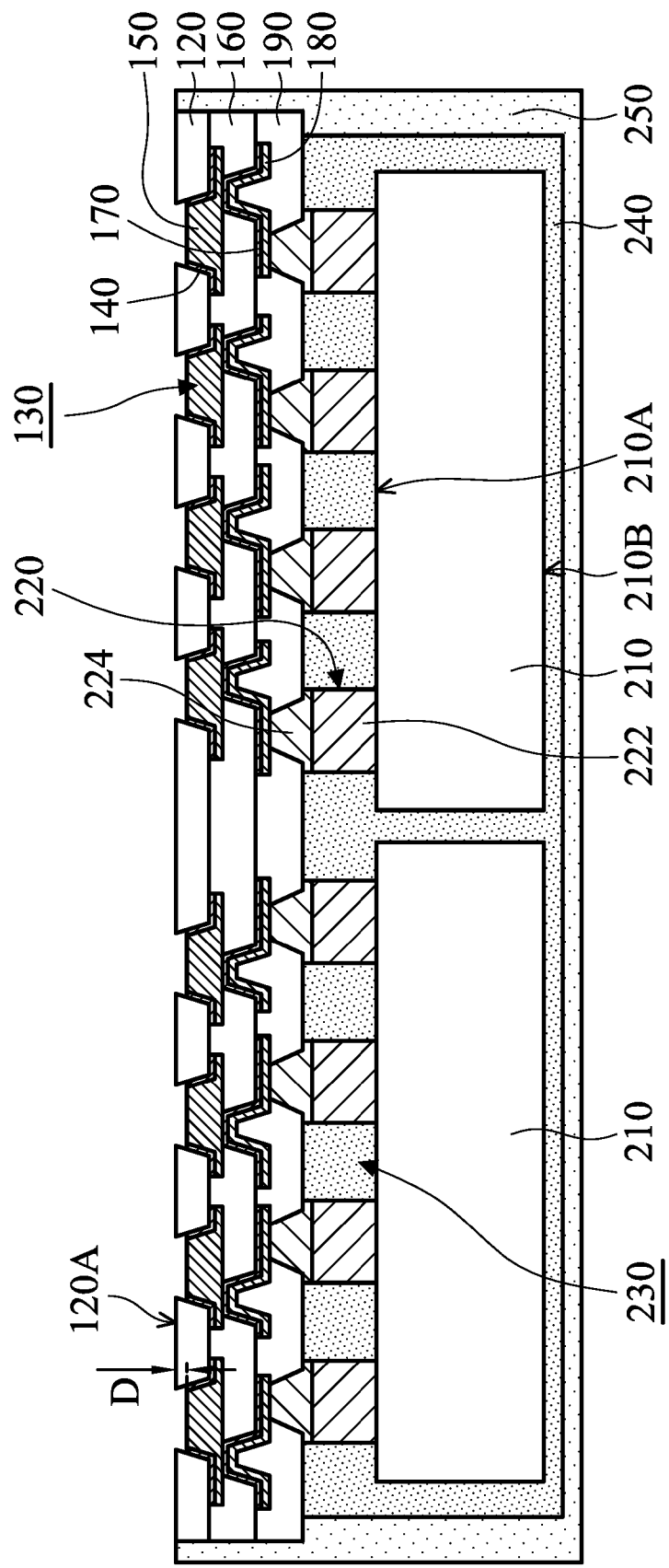

As shown in FIG. 1G, the structure shown in FIG. 1F is reversed. As a result, the integrated circuit dies 210 are supported by the package layers 240 and 250 after the removal of the carrier substrate 100. In some embodiments, there is no carrier substrate attached to the package layers 240 and 250 during subsequent processes.

As shown in FIG. 1G, the exposed portions of the conductive layer 140 are recessed in the openings 130, in accordance with some embodiments. As a result, the conductive layer 150 in the openings 130 is partially exposed. There is a recessed depth D that is measured from the surface 120A of the passivation layer 120 to the recessed conductive layer 140. In some embodiments, the recessed depth D is in a range from about 0.01 μm to about 0.5 μm.

In some embodiments, an etching process is used to recess the exposed portions of the conductive layer 140. The etching process is a dry etching process or a wet etching process. In some embodiments, the etching process is performed until the conductive layer 150 is exposed. In some embodiments, the conductive layer 150 is partially removed during the etching process.

In some cases, the exposed portions of the conductive layer 140 may be oxidized during processing. The oxidized portions of the conductive layer 140 are removed until the conductive layer 150 is exposed. As a result, the resistance between the conductive layer 150 and the subsequently formed conductive feature is prevented from being increased undesirably. Therefore, the electrical performance and reliability of the package structure is significantly enhanced.

Figure 1H:
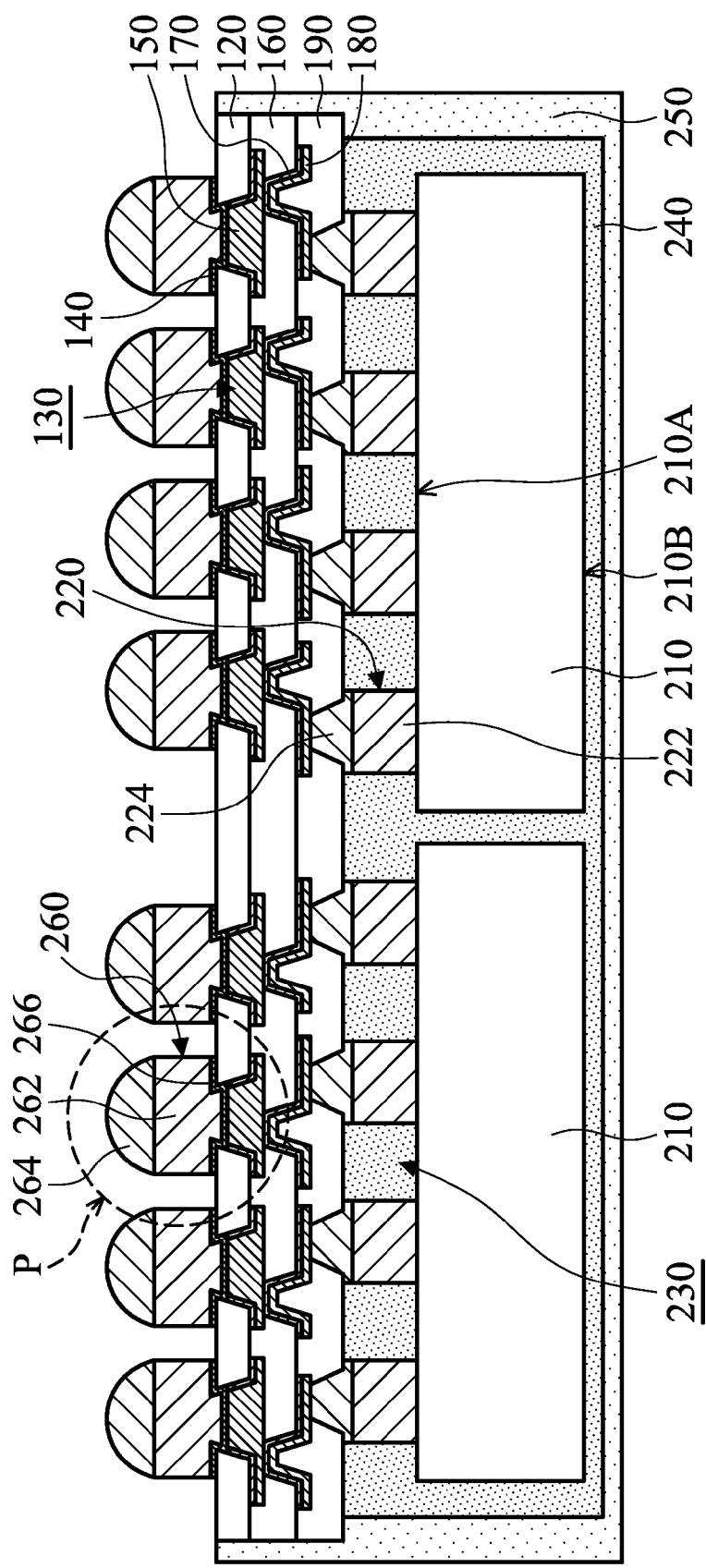

As shown in FIG. 1H, connectors 260 are formed to cover the openings 130, in accordance with some embodiments. As a result, the connectors 260 fill the openings 130 to electrically connect to the integrated circuit dies 210 through the conductive layer 150 in the openings 130. In some embodiments, the connectors 260 and the conductive layers 140 and 150 together fill the openings 130.

In some embodiments, the connectors 260 and the conductive layer 150 in the openings 130 gradually shrink along a direction from the integrated circuit dies 210 towards the connectors 260. In some embodiments, the connectors 260 and the conductive layer 150 in the openings 130 gradually shrink along a direction from the non-active surface 210B toward the active surface 210A of the integrated circuit dies 210. As a result, the conductive layer 150 in the openings 130 has a taper structure.

In some embodiments, each of the connectors 260 includes a conductive layer 266, a conductive bump 262 and a solder layer 264. The conductive bump 252 is between the conductive layer 266 and the solder layer 264.

FIG. 3 shows is an enlarged cross-sectional view of a portion P of the structure shown in FIG. 1H, in accordance with some embodiments. As shown in FIG. 3, the conductive layer 266 extends over the surface 120A of the passivation layer 120 and fills the openings 130, in accordance with some embodiments. The sidewall 120C is covered by the conductive layer 266 and the conductive layer 140. In some embodiments, a portion of the conductive layer 266 is sandwiched between the conductive layer 150 and the conductive bump 262. In some embodiments, the conductive layer 266 is in direct contact with the conductive layers 140 and 150.

In some embodiments, there is an interface 260A between the conductive layer 266 and the conductive layers 140 and 150. In some embodiments, the angle θ between the sidewall 120C and the interface 260A is greater than 0° and is less than or substantially equal to 90°. In some embodiments, the surface 120A of the passivation layer 120 is closer to the interface 260A than the surface 120B of the passivation layer 120.

In some embodiments, the conductive layer 266 is a seed layer. In some embodiments, the conductive layer 266 includes Ti. However, embodiments of the disclosure are not limited thereto. For example, the conductive layer 266 may include Ti alloy, Cu, Cu alloy, another suitable seed material, or a combination thereof. In some embodiments, the conductive layer 266 is deposited using a PVD process, a CVD process, another applicable process, or a combination thereof.

Many variations and/or modifications can be made to embodiments of the disclosure. In some other embodiments, the conductive layer 266 is an under bump metallurgy (UBM) layer. The UBM layer may include a diffusion barrier layer and a seed layer. The seed layer is between the diffusion barrier layer and the conductive bump 262. The diffusion barrier layer may include tantalum nitride, titanium nitride, tantalum, titanium, another suitable material, or a combination thereof.

In some embodiments, the conductive bump 262 extends over the surface 120A and fills the openings 130. In some other embodiments, the conductive bump 262 does not fill the openings 130. The conductive bump 262 may be a conductive pillar, another suitable conductive feature, or a combination thereof. In some embodiments, the conductive bump 262 includes copper, ENIG, ENEPIG, another suitable material, or a combination thereof. In some embodiments, the conductive bump 262 is deposited using an electroplating process, a sputtering process, another applicable process, or a combination thereof. Multiple deposition, coating, and/or etching processes may be used to form the connectors 260 including the conductive layer 266, the conductive bump 262 and the solder layer 264.

Many variations and/or modifications can be made to embodiments of the disclosure. In some other embodiments, the connectors 260 do not include conductive pillars. In some other embodiments, the connectors 260 are solder bumps, solder balls, other suitable connectors, or a combination thereof. In some embodiments, the connectors 260 are controlled collapse chip connection (C4) bumps and/or ball grid array (BGA) bumps.

Figure 1I:
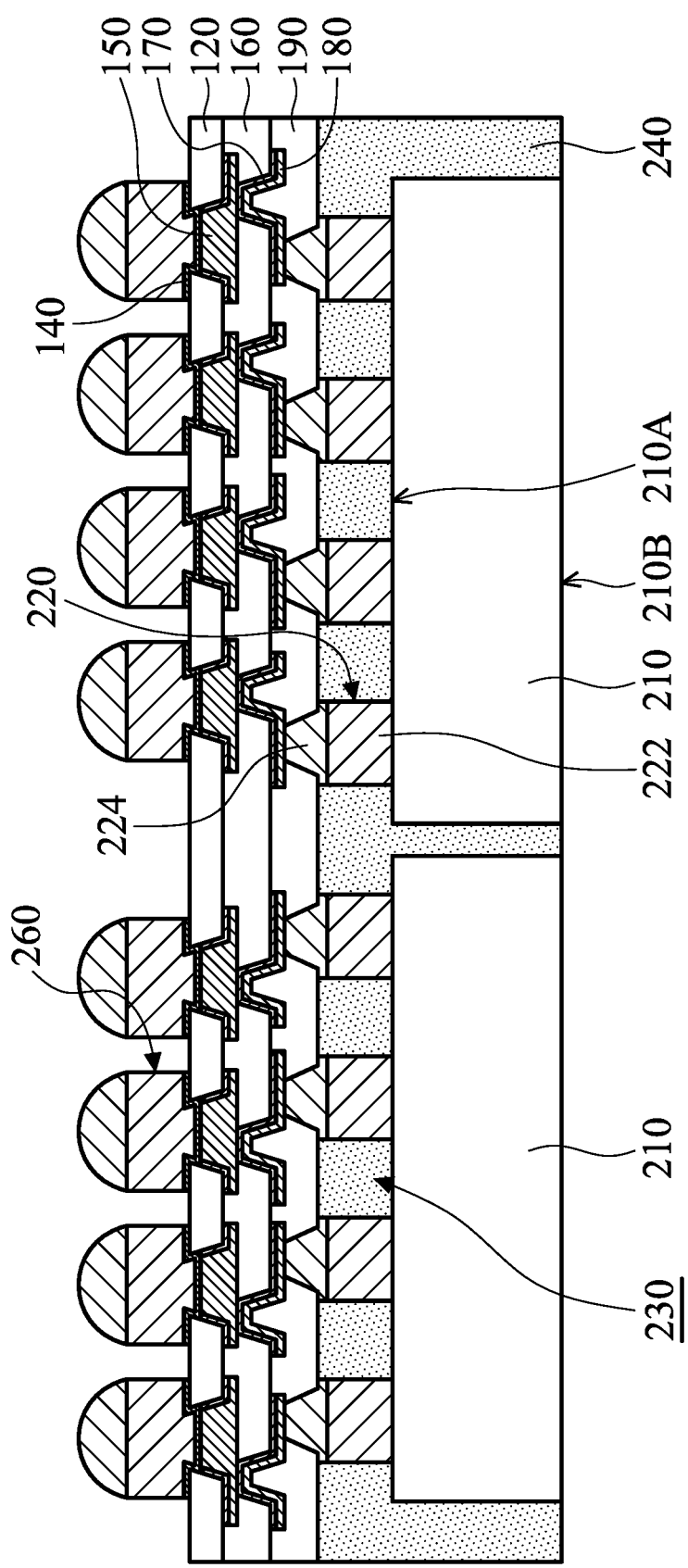

As shown in FIG. 1I, the package layers 240 and 250 are partially removed, in accordance with some embodiments. As a result, the non-active surface 210B of the integrated circuit dies 210 is exposed. It is advantageous for heat dissipation of the integrated circuit dies 210. In some embodiments, the edge 195 stays covered by the package layer 250 during the partial removal of the package layers 240 and 250.

In some embodiments, a planarization process is used to partially remove and thin the package layers 240 and 250. The planarization process includes a grinding process, a chemical mechanical polishing (CMP) process, an etching process, another applicable process, or a combination thereof.

Afterwards, a singulation process is performed to form multiple package structures. Each of the package structures includes one or more integrated circuit dies 210 embedded in the package layer 240, as shown in FIG. 1I. In some embodiments, the singulation process includes a dicing process to cut the package layer 240 and the passivation layer 120 along scribe lines by a saw blade or laser beam. The scribe lines extend around the integrated circuit dies 210 and intersect the edge 195. In some embodiments, each of the package structures is separated from the package layer 250 after the singulation process. As a result, the package layer 250 is removed from each of the package structures, as shown in FIG. 1I.

Although FIG. 1I shows that the non-active surface 210B of the integrated circuit dies 210 is exposed, embodiments of the disclosure are not limited thereto. In some other embodiments, the non-active surface 210B of the integrated circuit dies 210 stays covered by the package layers 240 and 250 during the singulation process. As a result, each of the package structures includes one or more integrated circuit dies 210 covered by the package layers 240 and 250.

Figure 4:
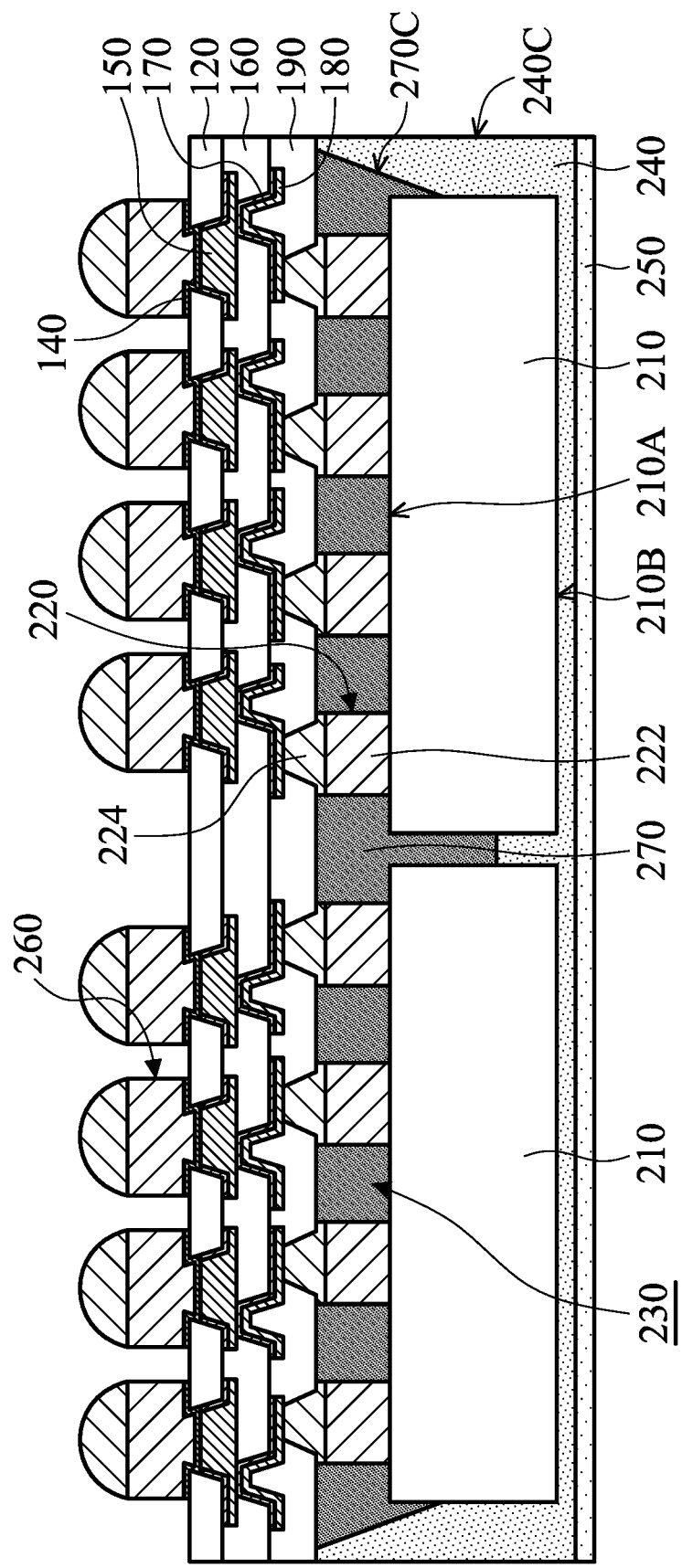
FIG. 4 is a cross-sectional view of a package structure, in accordance with some embodiments.

Many variations and/or modifications can be made to embodiments of the disclosure. FIG. 4 is a cross-sectional view of a package structure, in accordance with some embodiments. In some embodiments, the materials and/or formation methods of the package structure shown in FIG. 4 are similar to those of the package structure shown in FIG. 1I.

As shown in FIG. 4, a package layer 270 fills the space 230 between the active surface 210A of the integrated circuit dies 210 and the passivation layer 190, in accordance with some embodiments. As a result, the connectors 220 are surrounded by the package layer 270. In some embodiments, the package layer 270 does not extend over the non-active surface 210B of the integrated circuit dies 210. As a result, the integrated circuit dies 210 are partially embedded in the package layer 270. In some embodiments, the package layer 270 has a sidewall 270C that is inclined to the sidewall 240C of the package layer 240.

In some embodiments, the package layer 270 includes an underfill material or another suitable encapsulating material. In some embodiments, the package layer 270 includes a material that is different from that of the package layer 240 and/or the package layer 250.

In some embodiments, the package layer 270 has fillers dispersed therein. The fillers may include insulating fibers, insulating particles, other suitable elements, or a combination thereof. In some embodiments, the content or concentration of the fillers dispersed in the package layer 270 is in a range from about 60 wt % to about 85 wt %. In some embodiments, the size of the fillers dispersed in the package layer 270 is in a range from about 5 μm to about 20 μm. In some embodiments, the fillers dispersed in the package layer 240 and/or the package layer 250 have a (maximum) size that is greater than the fillers dispersed in the package layer 270.

In some embodiments, the package layer 270 is formed by a dispensing process, another applicable process, or a combination thereof. In some embodiments, a liquid underfill material is dispensed by capillary action and cured to form the package layer 270. In some embodiments, the package layer 270 is formed before the formation of the package layers 240 and 250.

Although FIG. 4 shows that the package structure has a non-active surface 210B of the integrated circuit dies 210 that is covered by the package layers 240 and 250, embodiments of the disclosure are not limited thereto. In some other embodiments, the package layers 240 and 250 are removed until the non-active surface 210B is exposed. As a result, the package structure does not include the package layer 250.

Figure 5A:
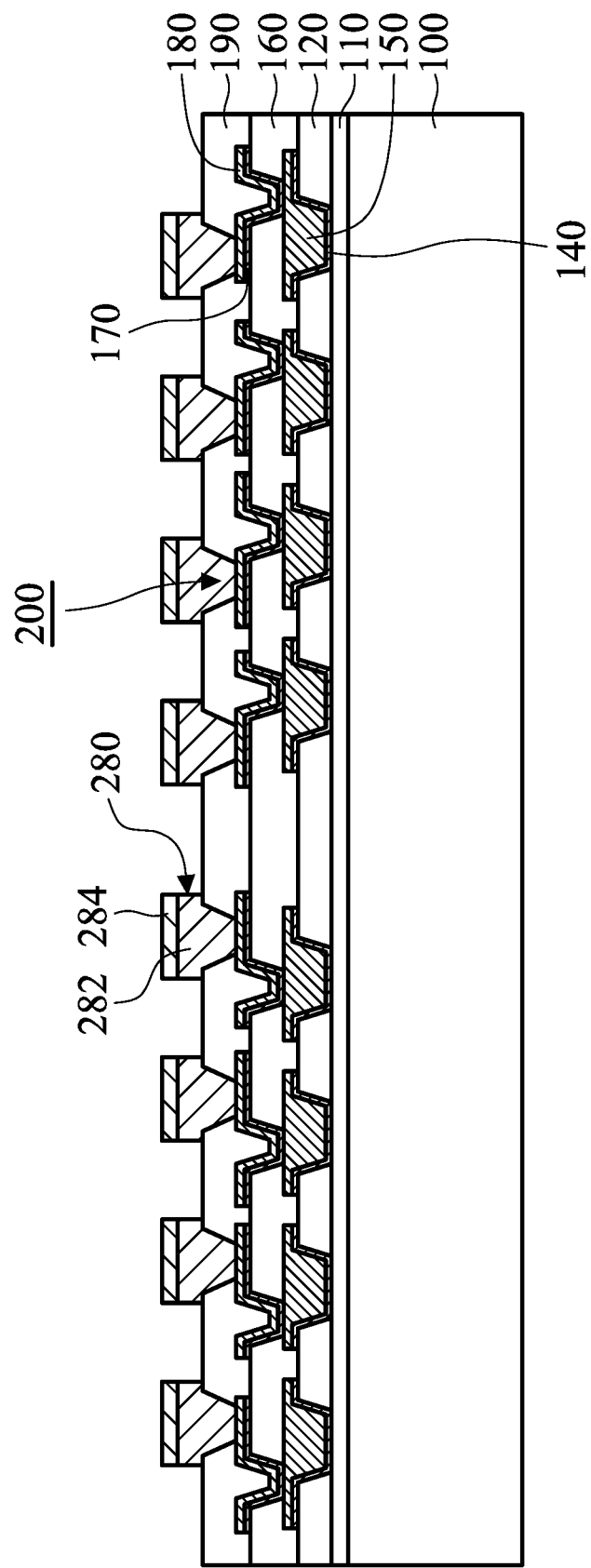
FIGS. 5A and 5B are cross-sectional views of various stages of a process for forming a package structure, in accordance with some embodiments.
Figure 5B:
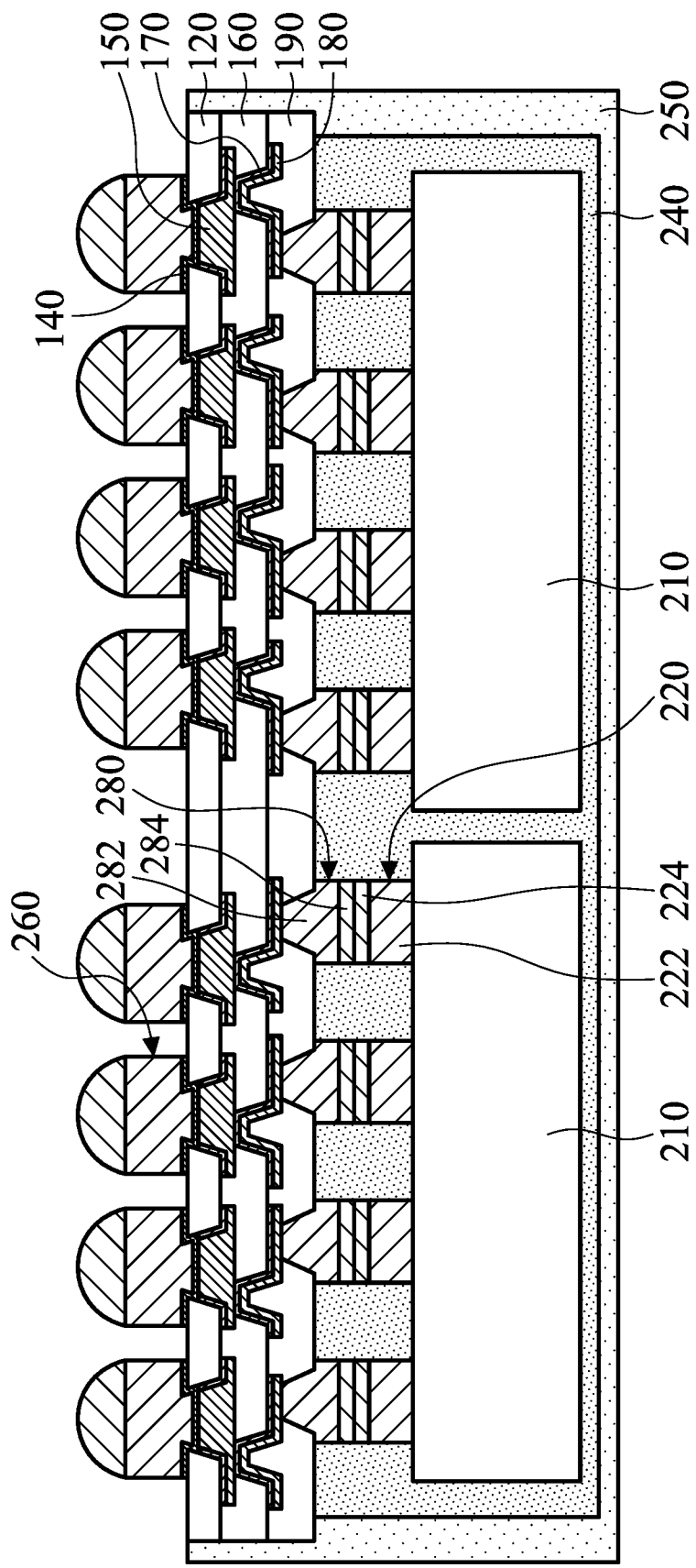

Many variations and/or modifications can be made to embodiments of the disclosure. FIGS. 5A and 5B are cross-sectional views of various stages of a process for forming a package structure, in accordance with some embodiments.

As shown in FIG. 5A, connectors 280 are formed over the passivation layer 190 and fill the openings 200 to electrically connect to the conductive layer 180, in accordance with some embodiments. In some embodiments, each of the connectors 280 includes a conductive bump 282 and a solder layer 284. The conductive bump 282 is between the conductive layer 180 and the solder layer 284. The conductive bump 282 may be a conductive pillar, another suitable conductive feature, or a combination thereof. In some embodiments, the conductive bump 282 includes copper, ENIG, ENEPIG, another suitable material, or a combination thereof.

Embodiments of the disclosure are not limited thereto. In some other embodiments, the connectors 280 include the conductive bump 282 without the solder layer 284. In some other embodiments, the connectors 280 do not include conductive pillars. In some other embodiments, the connectors 280 are solder bumps, solder balls, other suitable connectors, or a combination thereof.

Afterwards, multiple integrated circuit dies 210 are bonded to the conductive layer 180 through the connectors 220 and 280, in accordance with some embodiments. The connectors 220 are coupled to the integrated circuit dies 210 before bonding the integrated circuit dies 210. In some embodiments, a reflow process is performed to bond the solder layer 284 of the connectors 280 and the solder layer 224 of the connectors 220 together.

Subsequently, the steps described in FIGS. 1E-1H are performed to form the structure shown in FIG. 5B. In some embodiments, the package layer 240 fills the space 230 between the integrated circuit dies 210 and the passivation layer 190. As a result, the package layer 240 continuously surrounds the connectors 220 and 280. In some embodiments, the package layer 240 is in direct contact with the connectors 220 and 280. Afterwards, a singulation process is performed over the structure shown in FIG. 5B to form multiple package structures.

Embodiments of the disclosure provide a method for forming a package structure. The method includes forming a redistribution structure over a carrier wafer, and subsequently bonding an integrated circuit die to the redistribution structure through connectors. The method also includes forming a first package layer surrounding the integrated circuit die and the connectors. The first package layer is retracted inwardly from the wafer edge. The method further includes forming a second package layer that covers the sidewall of the first package layer and extends to the wafer edge. Due to the second package layer, it is advantageous for manufacturing equipment to handle or clamp the wafer structure with the first and second package layers. As a result, subsequent processes are successively performed over the wafer structure.

In accordance with some embodiments, the material of the second package layer is selected to control the degree of warpage of the wafer structure. For example, the material of the second package layer may have a high CTE to increase the warpage degree and result in positive warping. Alternatively, the material of the second package layer may have a low CTE to reduce the warpage degree and result in negative warping. As a result, the warpage degree of the wafer structure is compensated for by the second package layer. Accordingly, the package structure is prevented from cracking and has improved planarization. Therefore, the reliability of the package structure is significantly enhanced.

Furthermore, after the carrier wafer is removed, the second package layer provides support during the subsequent processes. No additional carrier wafer is attached to the first package layer. In accordance with some embodiments, the material of choice for the second package layer is substantially not critical. The second package layer may include a molding compound having fillers with a large size, rather than fine fillers. Accordingly, the method for forming the package structure is simple and the fabrication cost of the package structure is greatly reduced.

In addition, since the redistribution structure is formed before bonding the integrated circuit die (i.e., die last process), the integrated circuit die is prevented from being damaged during high-temperature processes for forming the redistribution structure. As a result, thermal loading of the integrated circuit die is reduced. Accordingly, reliability of the package structure is significantly enhanced.

In accordance with some embodiments, a method for forming a package structure is provided. The method includes providing a carrier substrate. The method also includes forming a conductive layer over the carrier substrate. The method further includes forming a passivation layer over the conductive layer. The passivation layer includes openings that expose portions of the conductive layer. In addition, the method includes bonding integrated circuit dies to the portions of the conductive layer through bumps. There is a space between the integrated circuit dies and the passivation layer. The method also includes filling the space with a first molding compound. The first molding compound surrounds the bumps and the integrated circuit dies. The method further includes forming a second molding compound capping the first molding compound and the integrated circuit dies. The passivation layer has a sidewall that is covered by the second molding compound.

In accordance with some embodiments, a method for forming a package structure is provided. The method includes providing a carrier substrate. The method also includes forming a conductive layer over the carrier substrate. The method further includes forming a passivation layer over the conductive layer. The passivation layer includes openings that expose portions of the conductive layer. The passivation layer has an edge. In addition, the method includes bonding an integrated circuit die to the portions of the conductive layer through connectors. The integrated circuit die has an active surface, which is coupled to the connectors, and a non-active surface. The method also includes forming a first package layer covering the passivation layer and the non-active surface to surround the connectors and the integrated circuit die. The first package layer is retracted inwardly from the edge. The method further includes forming a second package layer covering the first package layer. The second package layer extends to the edge.

In accordance with some embodiments, a package structure is provided. The package structure includes a package layer. The package structure also includes an integrated circuit die embedded in the package layer. The integrated circuit die has an active surface and a non-active surface. The package structure further includes a bump embedded in the package layer. The bump is coupled to the active surface. In addition, the package structure includes a redistribution layer over the package layer. The integrated circuit die is electrically connected to the redistribution layer through the bump. The package structure also includes a passivation layer covering the redistribution layer. The passivation layer includes an opening that partially exposes the redistribution layer. The package structure further includes a connector covering the opening. The opening is filled with a first portion of the redistribution layer and a second portion of the connector. The first portion gradually shrinks along a direction from the non-active surface toward the active surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
providing a carrier substrate;
forming a conductive layer over the carrier substrate;
forming a passivation layer over the conductive layer, wherein the passivation layer comprises openings that expose portions of the conductive layer;
bonding integrated circuit dies to the portions of the conductive layer through bumps, wherein there is a space between the integrated circuit dies and the passivation layer;
filling the space with a first molding compound, wherein the first molding compound surrounds the bumps and the integrated circuit dies;
forming a second molding compound capping the first molding compound and the integrated circuit dies, wherein the passivation layer has a sidewall that is covered by the second molding compound; and
cutting the first molding compound and the passivation layer to form the package structure, wherein the package structure is separated from the second molding compound.

2. The method for forming a package structure as claimed in claim 1, wherein the integrated circuit die has an active surface, which is coupled to the bumps, and a non-active surface, and wherein the first molding compound has a portion between the non-active surface and the second molding compound.

3. The method for forming a package structure as claimed in claim 2, further comprising removing the second molding compound and the portion of the first molding compound until the non-active surface is exposed, wherein the sidewall of the passivation layer stays covered by the second molding compound during the removal of the second molding compound and the portion of the first molding compound.

4. The method for forming a package structure as claimed in claim 1, wherein the first molding compound is formed by an immersion molding process, and the second molding compound is formed by a compression molding process.

5. The method for forming a package structure as claimed in claim 1, further comprising:
removing the carrier substrate after the filling of the space;
reversing the integrated circuit dies so that the integrated circuit dies are supported by the first molding compound and the second molding compound; and
forming second bumps after the reversal of the integrated circuit dies, wherein the second bumps are electrically connected to the integrated circuit dies through the conductive layer and the bumps.

6. The method for forming a package structure as claimed in claim 5, further comprising:

forming a second passivation layer over the carrier substrate before the formation of the conductive layer, wherein the second passivation layer comprises second openings;

forming a second conductive layer over the second passivation layer, wherein the second conductive layer has portions filling the second openings, and the portions of the second conductive layer are exposed after the removal of the carrier substrate; and recessing the exposed portions of the second conductive layer in the second openings before the formation of the second bumps, wherein the second bumps fill the second openings to electrically connect to the second conductive layer, and wherein the second openings gradually shrink along a direction from the integrated circuit dies towards the second bumps.

7. A method for forming a package structure, comprising:
providing a carrier substrate;
forming a conductive layer over the carrier substrate;
forming a passivation layer over the conductive layer, wherein the passivation layer comprises openings that expose portions of the conductive layer;
bonding an integrated circuit die to the portions of the conductive layer through connectors, wherein the integrated circuit die has an active surface, which is coupled to the connectors, and a non-active surface, and wherein the passivation layer has a sidewall and a top surface, the top surface of the passivation layer is facing the active surface of the integrated circuit die;
forming a first package layer covering the passivation layer and the non-active surface to surround the connectors and the integrated circuit die, wherein the first package layer is retracted inwardly from the sidewall of the passivation layer; and
forming a second package layer covering the first package layer, wherein the second package layer extends to the sidewall of the passivation layer.

8. The method for forming a package structure as claimed in claim 7, wherein the second package layer further extends along the sidewall of the passivation layer to cover and surround the sidewall of the passivation layer.

9. The method for forming a package structure as claimed in claim 7, further comprising thinning the first and second package layers, wherein the sidewall of the passivation layer is covered by the second package layer during the thinning of the first and second package layers.

10. The method for forming a package structure as claimed in claim 7, wherein the connectors comprise a first bump and a second bump between the integrated circuit die and the first bump, and wherein the first bump is coupled to the conductive layer before bonding the integrated circuit die, and the second bump is coupled to the active surface before bonding the integrated circuit die.

11. The method for forming a package structure as claimed in claim 7, wherein the second package layer has a coefficient of thermal expansion, which is greater than that of the first package layer.

12. The method for forming a package structure as claimed in claim 7, wherein there is a space between the integrated circuit die and the passivation layer, and the method further comprises filling the space with a third package layer before the formation of the first and second package layers.

13. The method for forming a package structure as claimed in claim 12, wherein the first, second and third package layers respectively comprise fillers having a first size, a second size and a third size, and the second size is greater than the first size and the third size.

14. A method for forming a package structure, comprising:
forming a first redistribution layer and a second redistribution layer over a carrier substrate;
forming a passivation layer covering the second redistribution layer;
bonding an integrated circuit die to the second redistribution layer through bumps;
forming a first package layer covering the passivation layer and surrounding the bumps and the integrated circuit die, wherein the first package layer is spaced apart from an edge of the passivation layer;
forming a second package layer covering and surrounding the first package layer and the edge of the passivation layer;
removing the carrier substrate after the formation of the second package layer; and
thinning the first package layer and the second package layer to expose the integrated circuit die.

15. The method for forming a package structure as claimed in claim 14, wherein the second package layer has a larger area than the carrier substrate.

16. The method for forming a package structure as claimed in claim 14, wherein the first redistribution layer comprises a conductive layer and a seed layer, and wherein the seed layer becomes exposed after the removal of the carrier substrate, and the conductive layer remains covered by the seed layer after the removal of the carrier substrate.

17. The method for forming a package structure as claimed in claim 16, further comprising:
etching the seed layer to expose the conductive layer; and
forming a connector adjoining the conductive layer and the seed layer after the etching of the seed layer.

18. The method for forming a package structure as claimed in claim 17, wherein a portion of the connector gradually shrinks along a direction from the integrated circuit die toward the connector.

19. The method for forming a package structure as claimed in claim 14, further comprising:
cutting the first package layer to form the package structure, wherein the package structure is separated from the second package layer.

20. The method for forming a package structure as claimed in claim 1, wherein the first molding compound and the second molding compound adjoin a top surface of the passivation layer.

* * * * *